US009230724B2

(12) United States Patent
Harrison

(10) Patent No.: US 9,230,724 B2
(45) Date of Patent: Jan. 5, 2016

(54) COOLING SYSTEM AND SUPERCONDUCTING MAGNET APPARATUS EMPLOYING THE SAME

(71) Applicant: Samsung Electronics Co., Ltd., Gyeonggi-do (KR)

(72) Inventor: Stephen M. Harrison, Wallingford (GB)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/321,013

(22) Filed: Jul. 1, 2014

(65) Prior Publication Data

US 2015/0015260 A1    Jan. 15, 2015

(30) Foreign Application Priority Data

Jul. 10, 2013    (KR) .................. 10-2013-0081196

(51) Int. Cl.
  *H01F 6/04*    (2006.01)
  *H01F 6/06*    (2006.01)
  *G01R 33/38*    (2006.01)
  *G01R 33/3815*    (2006.01)
  *F25D 19/00*    (2006.01)

(52) U.S. Cl.
  CPC *H01F 6/04* (2013.01); *F25D 19/00* (2013.01); *G01R 33/3804* (2013.01); *G01R 33/3815* (2013.01); *H01F 6/06* (2013.01); *F25B 2400/17* (2013.01)

(58) Field of Classification Search
  CPC ....................................................... H01F 6/04
  USPC ................... 505/163, 164, 892; 324/318, 319
  See application file for complete search history.

(56) References Cited

U.S. PATENT DOCUMENTS

| 4,765,153 | A |   | 8/1988 | Wachi |
| 5,782,095 | A |   | 7/1998 | Chen |
| 5,884,489 | A |   | 3/1999 | Retz et al. |
| 5,918,470 | A |   | 7/1999 | Xu et al. |
| 5,936,499 | A |   | 8/1999 | Eckels |
| 6,029,458 | A | * | 2/2000 | Eckels ........................... 62/47.1 |
| 6,107,905 | A | * | 8/2000 | Itoh et al. ....................... 335/216 |
| 8,973,378 | B2 | * | 3/2015 | Jiang et al. ..................... 62/51.1 |
| 9,014,769 | B2 | * | 4/2015 | Harrison ........................ 505/162 |
| 2007/0214802 | A1 |   | 9/2007 | Nemoto et al. |

(Continued)

FOREIGN PATENT DOCUMENTS

JP    11-243007 A    9/1999
JP    11-317307 A    11/1999

(Continued)

*Primary Examiner* — Louis Arana
(74) *Attorney, Agent, or Firm* — Cha & Reiter, LLC.

(57) ABSTRACT

A cooling system and a superconducting magnet apparatus employing the same. The cooling system includes: a thermal shield unit for thermally shielding a superconducting coil; a recondensing unit for recondensing an extremely low temperature refrigerant that cools down the superconducting coil. A cryocooler includes a body and an end portion extending from the body and inserted into the recondensing unit in order to directly contact the extremely low temperature refrigerant. A refrigerator chamber penetrates through the thermal shield unit and to which the cryocooler is attachably and detachably provided. A sealing member is disposed between the cryocooler and the refrigerator chamber to seal the recondensing unit.

20 Claims, 7 Drawing Sheets

(56) References Cited

U.S. PATENT DOCUMENTS

2009/0272127 A1* 11/2009 Radovinsky et al. .......... 62/50.7
2009/0275476 A1* 11/2009 Atrey ............................ 505/163

FOREIGN PATENT DOCUMENTS

| | | |
|---|---|---|
| JP | 2007-143625 A | 6/2007 |
| JP | 2009-267183 A | 11/2009 |

* cited by examiner

COOLING SYSTEM AND SUPERCONDUCTING MAGNET APPARATUS EMPLOYING THE SAME

CLAIM OF PRIORITY

This disclosure claims the benefit of priority from Korean Patent Application No. 10-2013-0081196, filed on Jul. 10, 2013, in the Korean Intellectual Property Office, the disclosure of which is incorporated by reference herein in its entirety.

BACKGROUND

1. Field

One or more embodiments of the present disclosure relate to a cooling system and a superconducting magnet apparatus employing the same. More particularly, one or more embodiments of the present disclosure relate to a cooling system having an improved mounting structure of a cryocooler, and a superconducting magnet apparatus employing the cooling system.

2. Description of the Related Art

A superconducting apparatus, such as a magnet resonance imaging (MRI) apparatus or a nuclear magnetic resonance (NMR) apparatus, uses a superconducting magnet. Superconductivity is a phenomenon where zero electrical resistance and expulsion of magnetic fields occurs in certain materials when cooled below a characteristic critical temperature. Superconductivity is characterized by the Meissner effect, in which the complete ejection of magnetic field lines from the interior of the superconductor occurs as it transitions into the superconducting state. Since the superconducting magnet maintains a superconducting phenomenon at an extremely low temperature, such as 4.2 K (−452.11° F.), a cooling system is required to maintain such an extremely low temperature. A currently commercialized cooling system generally cools down a superconducting magnet by using liquid helium.

A two-stage cryocooler that is generally employed in a cooling system may include a first stage operating at a temperature ranging from 40 K to 50 K, and a second stage operating at a temperature of 4 K. The second stage cools down a superconductor by both direct and indirect thermal contact (i.e., a superconducting coil), and the first stage cools down via a thermal shield unit that suppresses heat transfer between a room temperature and the superconductor. In the two-stage cryocooler, the second stage is often directly placed into a helium space so as to directly contact and condense a helium gas.

In order to locate a second stage of a general cryocooler in a helium space, the general cryocooler is perpendicularly mounted on a chamber of a superconducting magnet apparatus. If the general cryocooler is not perpendicularly mounted on the chamber, a body of the general cryocooler needs to be in a vacuum space so as to prevent loss of helium. In this case, the second stage of the general cryocooler does not directly contact the helium steam, and thus, a thermal interface is required between the second stage and the helium steam. However, since the thermal conductivity of the thermal interface is limited, a cooling power of the general cryocooler deteriorates.

SUMMARY

One or more embodiments described in this disclosure are about a cooling system for efficiently cooling helium, and a superconducting magnet apparatus employing the cooling system.

Additional aspects will be set forth in part in the description which follows and, in part, will be apparent from the description, or may be learned by practice of the presented embodiments.

According to one or more embodiments of the present invention, a cooling system includes: a thermal shield unit for thermally shielding a superconducting coil; a recondensing unit for recondensing an extremely low temperature refrigerant that cools down the superconducting coil; a cryocooler including a body and an end portion extending from the body, in which the end portion is inserted into the recondensing unit and in direct contact with the extremely low temperature refrigerant; and a refrigerator chamber penetrating through the thermal shield unit and to which the cryocooler is attachably and detachably provided, wherein a sealing member is disposed between the cryocooler and the refrigerator chamber to seal the recondensing unit.

According to an embodiment, a space between the body of the cryocooler and the refrigerator chamber may be in a vacuum state.

According to an embodiment, the sealing member may be a gasket inserted into a body side end circumference of the end portion of the cryocooler.

According to an embodiment, a protrusion may be formed on a body side end circumference of the end portion of the cryocooler, and wherein the protrusion may press against the sealing member when the cryocooler is inserted into the refrigerator chamber such that the sealing member is adhered to one side of the refrigerator chamber. A partition wall adhered to the sealing member pressed by the protrusion may be formed on an inlet circumference of the recondensing unit into which the end portion of the cryocooler is inserted.

The partition wall may be formed, for example, to face the protrusion across the sealing member. The partition wall may extend in a lengthwise direction of the end portion of the cryocooler, and the sealing member may be slidably inserted and adhered between an inner surface of the partition wall and an outer surface of the end portion of the cryocooler.

The sealing member may be formed, for example, of activated polytetrafluoroethylene, indium, copper, or polyimide.

The cryocooler may be, for example, a two-stage refrigerator, n in which the cryocooler may further include a first stage for cooling down the thermal shield unit and the end portion may be a second stage extending from the first stage. A heat sink may contact at least a part of a circumference of the first stage of the cryocooler, and contact the thermal shield unit.

A cold plate may contact at least a part of a circumference of the first stage of the cryocooler, and contact the thermal shield unit.

The refrigerator chamber may be formed horizontally or in a slanted position with respect to the thermal shield unit.

The extremely low temperature refrigerant may be helium,

The cooling system may further include a container holding the extremely low temperature refrigerant, wherein the superconducting coil may be cooled down by immersion in the extremely low temperature refrigerant in the container. The cooling system may further include, for example, a thermal exchange tube containing the extremely low temperature refrigerant, wherein the superconducting coil may be cooled down by being in contact with the thermal exchange tube.

According to one or more embodiments, a superconducting magnet apparatus includes: a superconducting coil; a housing on which the superconducting coil is mounted; and a cooling system for cooling the superconducting coil, wherein the cooling system includes: a thermal shield unit for thermally shielding the superconducting coil; a recondensing unit for recondensing an extremely low temperature refrigerant that cools down the superconducting coil; a cryocooler comprising a body and an end portion extending from the body and arranged into the recondensing unit, in order to directly contact the extremely low temperature refrigerant; and a refrigerator chamber penetrating through the thermal shield unit and to which the cryocooler is attachably and detachably provided. In addition, a sealing member is disposed between the cryocooler and the refrigerator chamber to seal the recondensing unit.

The cryocooler of the cooling system may be provided at a side surface, a top surface, or a bottom surface of the housing.

The superconducting magnet apparatus may be, for example, a magnet resonance imaging (MRI) apparatus.

BRIEF DESCRIPTION OF THE DRAWINGS

These and/or other aspects described in the disclosure will become more readily appreciated by a person of ordinary skill from the following description of the embodiments, taken in conjunction with the accompanying drawings in which.

DETAILED DESCRIPTION

Figure 1:
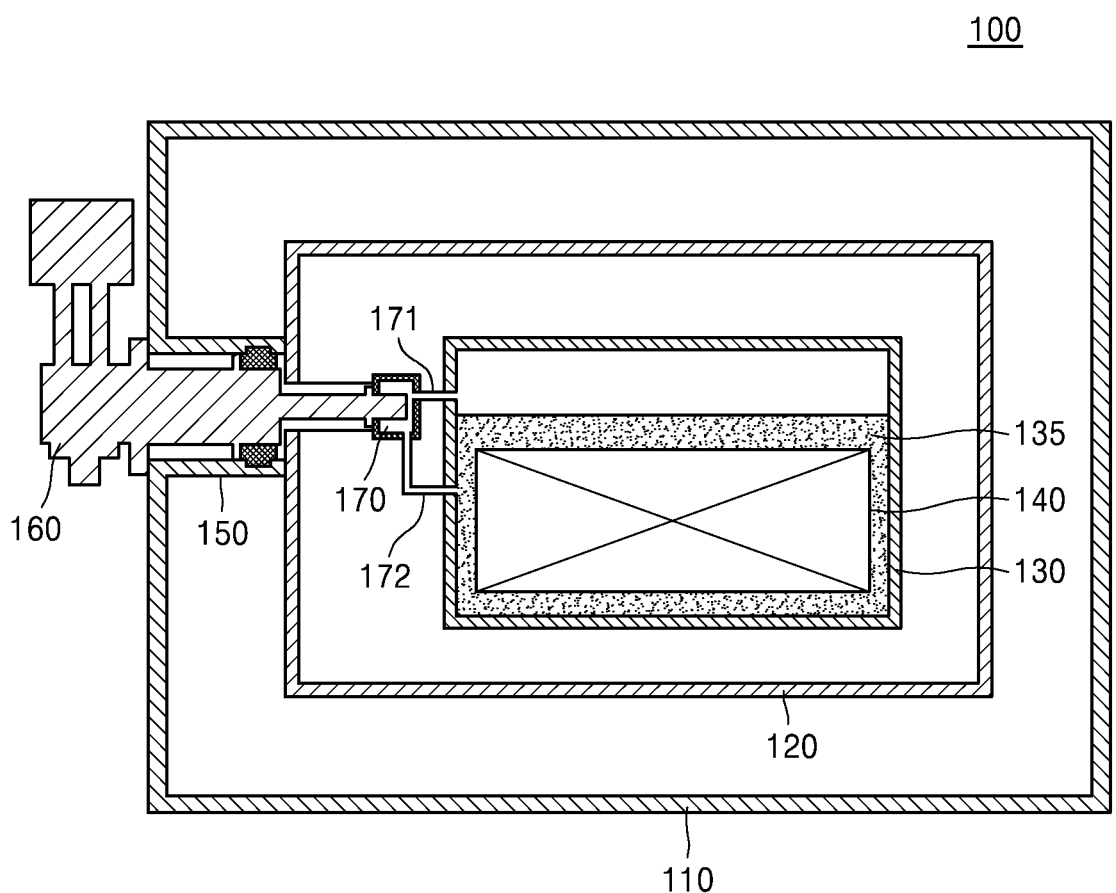
FIG. 1 is a cross-sectional diagram schematically illustrating a cooling system according to an embodiment of the present invention.

Advantages and features of one or more embodiments of the present invention and methods of accomplishing the same may be understood and appreciated more readily by a person or ordinary skill with reference to the following detailed description of the embodiments and the accompanying drawings. In this regard, the present embodiments may have different forms and the appended claims should not be construed as being limited to the descriptions set forth herein. Rather, these embodiments are provided so that this disclosure will be thorough and complete for written description and enablement, and will fully convey the concept of the present embodiments as reflected in the appended claims. The present invention will be defined by the appended claims. Like reference numerals refer to like elements throughout the specification.

Hereinafter, the terms used in the specification will now be briefly defined, and the embodiments will now be described in more detail.

All terms including descriptive or technical terms which are used herein should be construed as having meanings that are understood by one of ordinary skill in the art. However, the terms may have different meanings according to an intention of one of ordinary skill in the art, precedent cases, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

When a part "includes" or "comprises" an element, unless there is a particular description contrary thereto, the part can further include other elements, not excluding the other elements.

As used in the specification and claims, the term "extremely low temperature" refers to a temperature at which the superconducting magnet maintains a superconducting phenomenon.

Reference will now be made in detail to embodiments, examples of which are illustrated in the accompanying drawings. In this regard, the present embodiments may have different forms and should not be construed as being limited to the descriptions set forth herein. In the following description, well-known functions or constructions may not be described in detail when their inclusion would obscure the embodiments with unnecessary detail.

FIG. 1 is a diagram schematically illustrating a cooling system 100 according to an embodiment of the present invention.

Referring now to FIG. 1, the cooling system 100 according to the current embodiment includes a container 130 where a superconducting magnet 140 is located, a thermal shield unit 120 for thermally blocking the container 130 from the outside, and a vacuum container 110 for sealing the thermal shield unit 120 in a vacuum space. An extremely low temperature refrigerant 135, such as helium, is used for cooling a superconducting coil 140 down to, for example, a temperature of less than 4.2 K, and is placed in an internal space of the container 130. The thermal shield unit 120 surrounds the container 130 in order to shield the container 130 from ambient heat. The cooling system 100 may further include a cooler (refer to a cooler 350 shown in FIG. 7) that is connected to a cryocooler 160, or an extremely low temperature refrigerant supplier for supplementing the extremely low temperature refrigerant 135 that evaporates.

A refrigerator chamber 150 having spaces 151, 152 (FIG. 2) through which the cryocooler 160 passes is provided partially within the thermal shield unit 120 and the container 130.

Figure 2:
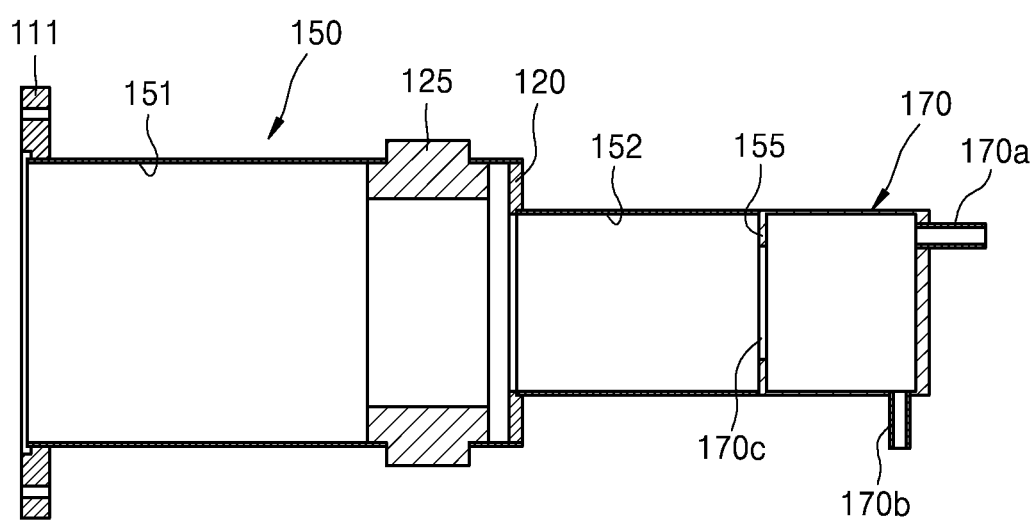
FIG. 2 is a cross-sectional diagram of a refrigerator chamber of the cooling system of FIG. 1.
Figure 3:
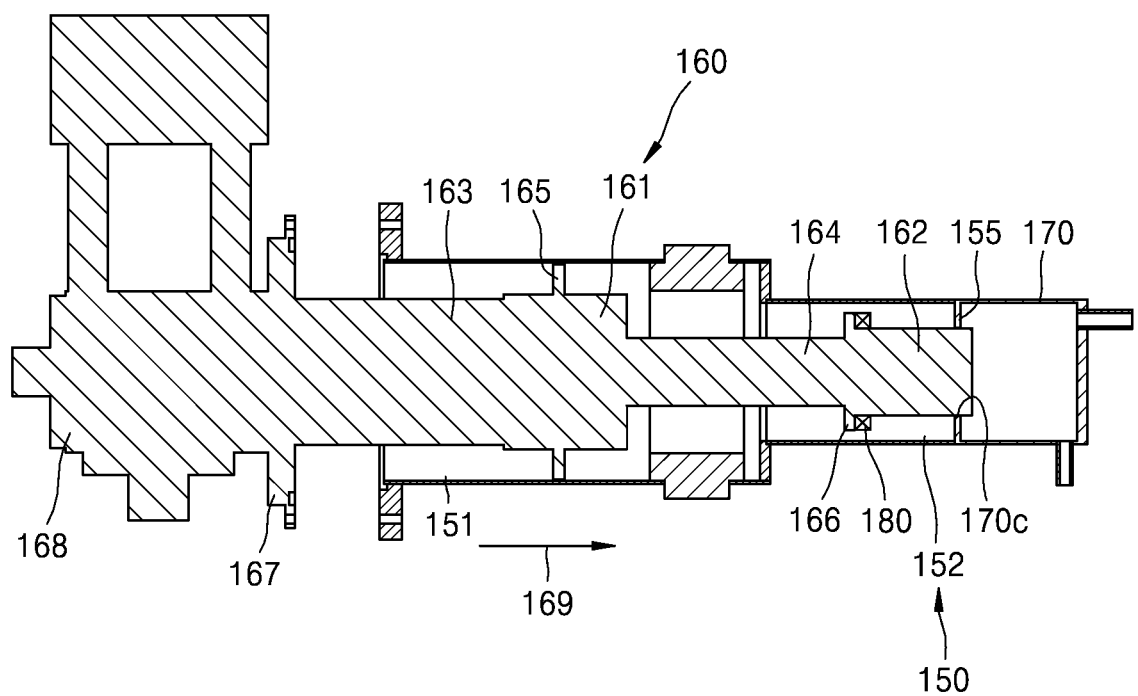
FIG. 3 is a cross-sectional diagram of a cryocooler partially inserted into the refrigerator chamber of FIG. 2.
Figure 4:
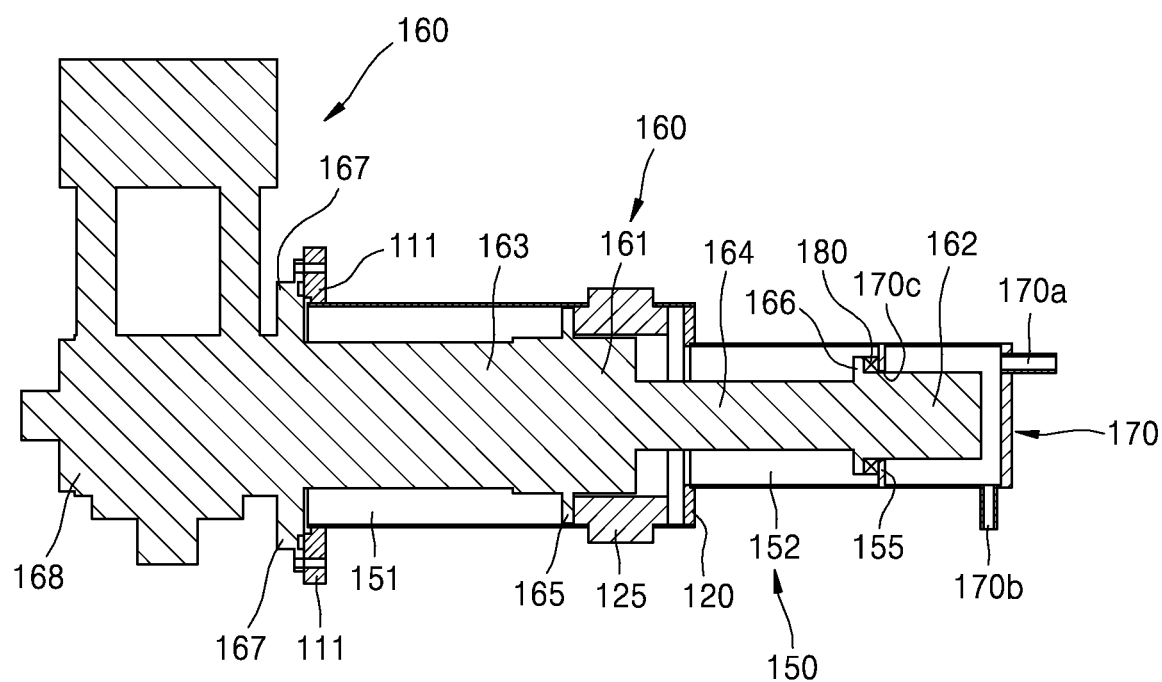
FIG. 4 is a cross-sectional diagram of the cryocooler completely inserted into the refrigerator chamber of FIG. 2.

FIG. 2 is a diagram of the refrigerator chamber 150 of the cooling system 100 of FIG. 1 when the cryocooler 160 is not inserted in the refrigerator chamber 150, FIG. 3 is a diagram of the cryocooler 160 partially inserted into the refrigerator chamber 150, and FIG. 4 is a diagram of the cryocooler 160 maximally inserted into the refrigerator chamber 150. A reference numeral 169 in FIG. 3 indicates a direction of inserting the cryocooler 160.

Referring to FIGS. 2 through 4, the refrigerator chamber 150 includes first and second accommodating spaces 151 and 152 into which the cryocooler 160 is partially inserted, and a recondensing unit 170 at an inner end of the refrigerator chamber 150. The recondensing unit 170 may be spatially separated from the container 130 containing the extremely low temperature refrigerant 135. The recondensing unit 170 includes an inlet hole 170a and an outlet hole 170b into and from which the extremely low temperature refrigerant 135 flows in and is discharged. The inlet hole 170a of the recondensing unit 170 is connected to an outlet hole of the container 130 through a first pipe 171 through which the extremely low temperature refrigerant 135 flows in an evaporated (i.e. gaseous) state, and the outlet hole 170b of the recondensing unit 170 is connected to an inlet hole of the container 130 through a second pipe 172 through which the extremely low temperature refrigerant 135 flows in a liquefied state. As subsequently described herein, the outlet hole 170b of the recondensing unit 170 may be located below the inlet hole 170a of the recondensing unit 170 such that after the extremely low temperature refrigerant 135 in the evaporated (gaseous) state flows into the inlet hole 170a of the recondensing unit 170, the extremely low temperature refrigerant 135 is recondensed and liquefied to be discharged through the outlet hole 170b of the recondensing unit 170. Also, a partition wall 155 is disposed between the refrigerator chamber 150 and the recondensing unit 170. An entrance 170c of the recondensing unit 170 into which the end portion (i.e., a second stage 162) of the cryocooler 160 is inserted is formed at the partition wall 155. As shown in FIG. 2, an inner end of the refrigerator chamber 150 is opened towards the recondensing unit 170 through which helium is transferred, and an outer end of the refrigerator chamber 150 is opened towards the outside (i.e., air) when the cryocooler 160 is not inserted into the refrigerator chamber 150.

As shown in FIG. 3, the cryocooler 160 may be a two-stage cryocooler including a first stage 161 and the second stage 162 extending from the first stage 161. The first and second stages 161 and 162 operate at different temperatures. For example, the first stage 161 may operate at a temperature from 40 K to 50 K, and the second stage 162 may operate at a temperature of 4 K. Such a cryocooler 160 may be a well known refrigerator, such as a Gifford-McMahon (GM) refrigerator or a pulse tube refrigerator.

The first stage 161 and a body 163 are received in the first accommodating space 151 of the refrigerator chamber 150. All or a part of the first stage 161 may directly or indirectly thermally contact the thermal shield unit 120 to cool down the thermal shield unit 120. A heat sink 125 thermally contacting the thermal shield unit 120 may be provided at the first accommodating space 151. The heat sink 125 thermally contacts the thermal shield unit 120. As shown in FIG. 4, the heat sink 125 cools down the thermal shield unit 120 by thermally contacting the first stage 161. The first stage 161 may include a protrusion 165 to increase a contact area with the heat sink 125. The protrusion 165 may protrude in a ring shape along an outer circumference of the first stage 161.

With reference to FIGS. 3 and 4, a body 164 is of the second stage 162 is received in the second accommodating space 152 of the refrigerator chamber 150. The second stage 162 of the refrigerator chamber 150 is inserted into the recondensing unit 170 to directly contact the extremely low temperature refrigerant 135 in the recondensing unit 170.

A stopping portion 166 (FIGS. 3 and 4) may be formed on a boundary of the second stage 162 and the body 164 of the second stage 162. The stopping portion 166 may have a ring shape protruding along a circumference of the second stage 162. The stopping portion 166 supports a sealing member 168.

Meanwhile, as shown in FIGS. 3 and 4, when the cryocooler 160 is inserted into the refrigerator chamber 150 and thus the second stage 162 is placed within the recondensing unit 170, the recondensing unit 170 is sealed from the refrigerator chamber 150. The recondensing unit 170 may be sealed via a sealing member 180 inserted into the second stage 162 of the cryocooler 162. The sealing member 180 may have a ring shape and is inserted around a circumference of the body 164 of the second stage 162. The material that can be used for the sealing member 180 is not limited as long as a sealing function is maintained at an extremely low temperature commensurate with cryogenic devices. For example, the sealing member 180 may be a gasket formed of activated polytetrafluoroethylene (PTFE), indium, copper, or polyimide, just to name some non-limiting possibilities.

As described above, the partition wall 155 is formed along the entrance 170c of the recondensing unit 170, may be ring-shaped. Accordingly, when the second stage 162 is placed at the recondensing unit 170 as the cryocooler 160 is inserted into the refrigerator chamber 150, the stopping portion 166 at the second stage 162 and the partition wall 155 of the refrigerator chamber 150 press and adhere to two surfaces of the sealing member 180, thereby sealing the recondensing unit 170 from the refrigerator chamber 150. Since the recondensing unit 170 is sealed from the refrigerator chamber 150, the second stage 162 may directly contact the extremely low temperature refrigerant 135 without leakage.

The first and second accommodating spaces 151 and 152 may vary according to a shape of the cryocooler 160. For example, an outer diameter of the second stage 162 may be smaller than an outer diameter of the first stage 161. Accordingly, an outer diameter of the second accommodating space 152 accommodating the body 164 of the second stage 162 may be smaller than an outer diameter of the first accommodating space 151 accommodating the body 163.

As shown in FIG. 4, after the cryocooler 160 is maximally inserted into the refrigerator chamber 150, a flange 167 of the cryocooler 160 and a flange 111 of the refrigerator chamber 150 may be detachably combined by a fastener, including but not limited to a bolt. After the flange 167 of the cryocooler 160 and the flange 111 of the refrigerator chamber 150 are coupled to each other, air in the refrigerator chamber 150 is evacuated such that the first and second accommodating spaces 151 and 152 of the refrigerator chamber 150 are in a vacuum state, thereby the first stage 161 or the bodies 163 and 164 of the cryocooler 160 are arranged in a vacuum space.

Referring back to FIG. 1, the refrigerator chamber 150 according to the current embodiment may pass through the vacuum container 110 and the thermal shield unit 120 in a horizontal (lateral) direction relative to the view in FIG. 1. As described above, since the first stage 161 or the bodies 163 and 164 are disposed in the first and second accommodating spaces 151 and 152 in a vacuum state, an installation orientation of the cryocooler 160 may be freely chosen. In other words, the refrigerator chamber 150 may be formed in a horizontal direction of the vacuum container 110 as in the current embodiment, or at a bottom (e.g. lower) surface of the vacuum container 110. Of course, the refrigerator chamber 150 may also be formed at a top (e.g. upper) portion of the vacuum container 110.

Operations of the cooling system 100 according to the current embodiment will now be described.

When the cryocooler 160 is inserted into the refrigerator chamber 150, the recondensing unit 170 is sealed from the refrigerator chamber 150 by the sealing member 180 by adhering a surface of the stopping portion 166 and a surface of the sealing member 180 and adhering the partition wall 155 and the other surface of the sealing member 180. Meanwhile, the flange 111 of the refrigerator chamber 150 and the flange 167 of the cryocooler 160 are coupled to each other to seal and vacuum the first and second accommodating spaces 151 and 152 of the refrigerator chamber 150. In the container 130 where the superconducting magnet 140 is located, the extremely low temperature refrigerant 135 may evaporate over time, and the evaporated extremely low temperature refrigerant 135 may flow towards the inlet hole 170a of the recondensing unit 170 through the pipe. The second stage 162 of the cryocooler 160 cools down the evaporated extremely low temperature refrigerant 135 to an extremely low temperature (for example, less than 4.2 K with respect to a helium gas) while directly contacting the extremely low temperature refrigerant 135 and liquefies the same. The liquefied extremely low temperature refrigerant 135 is discharged towards the outlet hole 170b of the recondensing unit 170 to move back to the container 130 through the pipe so that the container 130 normally operates. As such, the cooling system 100 according to the current embodiment may have improved cooling capacity and cooling efficiency as the end portion, i.e., the second stage 162, of the cryocooler 160 directly contacts the extremely low temperature refrigerant 135. Also, in the cooling system 100 of the current embodiment, since the first stage 161 or the bodies 163 and 164 are placed in a vacuum space, the loss of the extremely low temperature refrigerant 135, such as helium, is reduced, and a period of recharging the extremely low temperature refrigerant 135 in the cooling system 100 may be extended.

In the cooling system 100 of the current embodiment, the sealing member 180 is disposed between the stopping portion 166 of the cryocooler 160 and the partition wall 155 at the entrance 170c of the recondensing unit 170. Accordingly, the sealing member 180 seals the recondensing unit 170 by adhering a surface of the stopping portion 166 and a surface of the sealing member 180 and adhering the partition wall 155 and the other surface of the sealing member 180 (i.e., face sealing), but an embodiment of the present invention is not limited thereto and the sealing member 180 may seal the recondensing unit 170 in any method.

Figure 5:
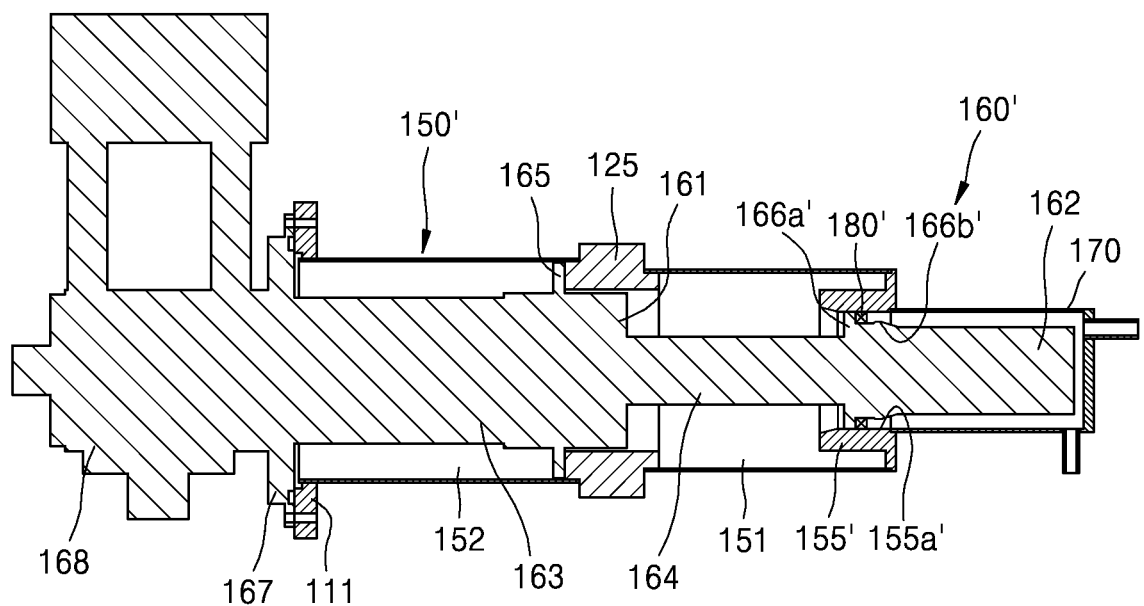
FIG. 5 is a cross-sectional diagram of a cooling system according to another embodiment of the present invention.

FIG. 5 is a diagram of a sealing method according to another embodiment of the present invention. Referring now to FIG. 5, a partition wall 155' at an entrance of the recondensing unit 170 externally extends such that an inner surface 155a' of the partition wall 155' faces an outer circumference of the second stage 162 of a cryocooler 160' and has a predetermined length in a length direction. Two stopping portions 166a' and 166b' spaced apart from each other are formed at an end of the body 164 of the second stage 162 of the cryocooler 160', and a sealing member 180' may be inserted between the two stopping portions 166a' and 166b'. The stopping portions 166a' and 166b' prevents the sealing member 180' from moving.

When the cryocooler 160' is maximally inserted into a refrigerator chamber 150' while the sealing member 180' is inserted into the second stage 162 of the cryocooler 160', the sealing member 180' is slidably inserted into the inner surface 155a' of the partition wall 155' at the entrance of the recondensing unit 170 when the second stage 162 passes the partition wall 155'. Accordingly, one surface of the sealing member 180' is adhered to an outer circumference of the second stage 162, and the other surface of the sealing member 180' is adhered to the inner surface 155a' of the partition wall 155' to seal the recondensing unit 170 from the refrigerator chamber 150' via a sliding sealing method.

In addition, an artisan should understand and appreciate that in the cooling system 100 or 200 described above, the cryocooler 160 or 160' is a two-stage refrigerator, but an embodiment of the present invention is not limited thereto. For example, the cryocooler 160 or 160' may be a one-stage refrigerator including only the end portion inserted into the recondensing unit 170, a three-stage refrigerator, or a have a greater than three stage refrigerator.

Figure 6:
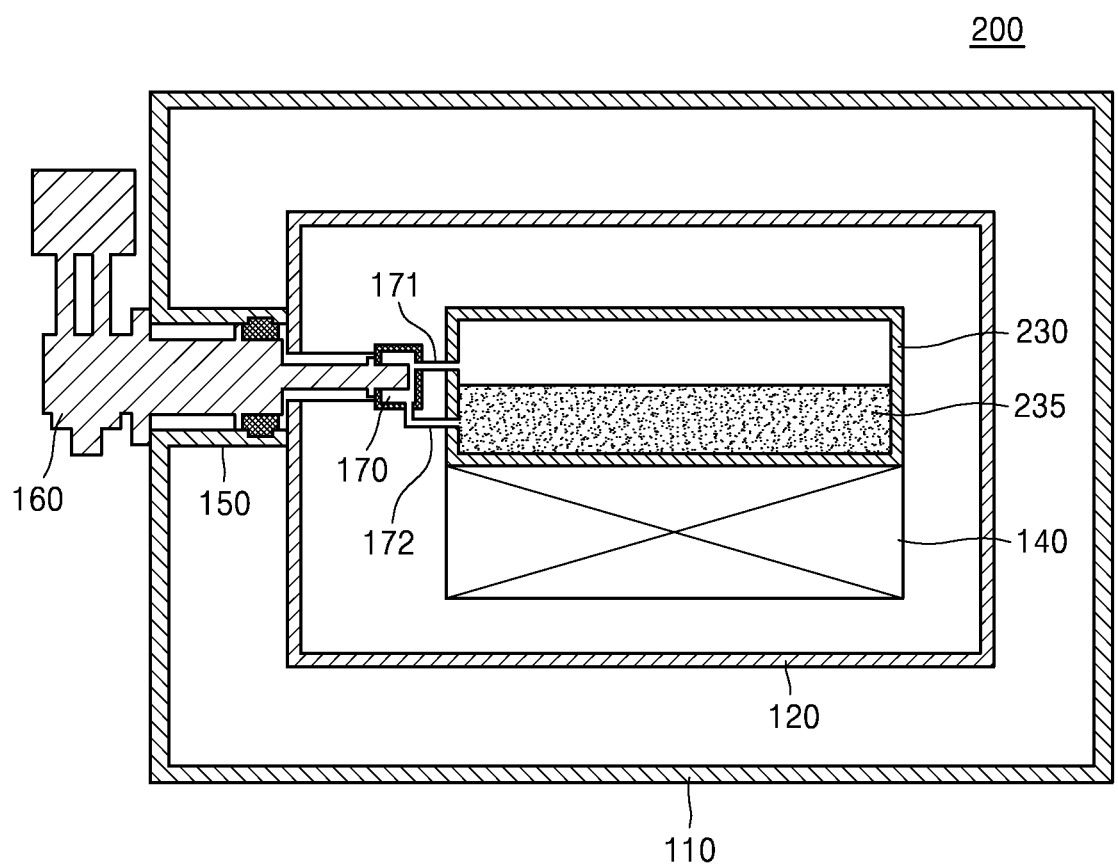
FIG. 6 is a cross-sectional diagram of a cooling system according to another embodiment of the present invention.

Also, the cooling system 100 or 200 described above includes the recondensing unit 170, but an embodiment of the present invention is not limited thereto. The second stage 162 of the cryocooler 160 may be directly inserted into the container 130 containing the extremely low temperature refrigerant 135, such as helium. In this case, the container 130 is sealed as the sealing member 180 or 180' is disposed at the entrance of the container 130 into which the second stage 162 of the refrigerator 160 or 160' is inserted. Moreover, in the cooling system 100 or 200, the superconducting magnet 140 is cooled down by being immersed in the extremely low temperature refrigerant 135 in the container 130, but a method of cooling the superconducting magnet 140 is not limited thereto. For example, as shown in FIG. 6, the superconducting magnet 140 may be cooled down by thermally contacting a thermal exchange tube 230 in which an extremely low temperature refrigerant 235 is sealed, and the recondensing unit 170 may be connected to the thermal exchange tube 230.

The cooling system 100 or 200 described above may be applied to an apparatus using a superconducting magnet, such as a magnetic resonance imaging (MRI) apparatus, a nuclear magnetic resonance (NMR) apparatus, or a superconducting magnet apparatus for a magnet levitation (Maglev) car.

Figure 7:
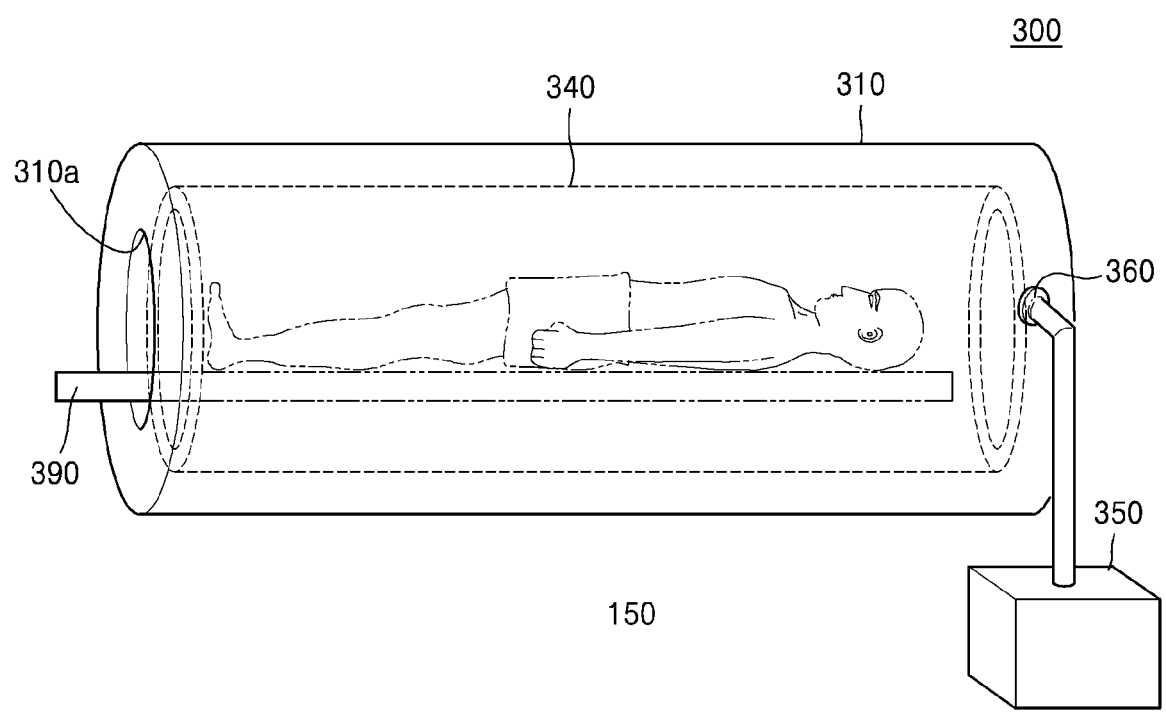
FIG. 7 is a diagram schematically showing a superconducting magnet apparatus according to an embodiment of the present invention.

FIG. 7 is a diagram schematically illustrating an example of the foregoing embodiments of the cooling system 100 or 200 being applied to the MRI apparatus. Referring now to FIG. 7, the superconducting magnet apparatus 300 according to the current embodiment includes a housing 310, a superconducting magnet 340 provided in the housing 310, a cryocooler 360 for cooling the superconducting magnet 340, and a cooler 350 connected to the cryocooler 360. The housing 310 may have a cylindrical structure having a bore 310a, and a table 390 on which a subject is placed and who may be inserted into the bore 310a. In addition to the superconducting magnet 340, a gradient coil for giving location information of a magnetic field by applying a gradient magnetic field, and a radio frequency (RF) coil for applying electromagnetic waves to a body to resonate a magnetization vector in the body and receive a magnetic resonance generated in the body may be provided in the housing 310. The gradient coil and the RF coil are used to provide a magnetic resonance image and are well known in the related art, and the embodiment of the present invention is not limited thereto. The cooling system 100 or 200 described above may be used in the superconducting magnet apparatus 300. In other words, the vacuum container 110, the thermal shield unit 120, and the container 130 described above may be disposed in the housing 310, the refrigerator chamber 150 or 150' may be formed at a side surface of the housing 310, and the cryocooler 360 may be the cryocooler 160 or 160' described above. Accordingly, as shown in FIG. 7, the cryocooler 360 may be inserted from the side surface of the housing 310, and thus, the superconducting magnet apparatus 300 may be easily designed and arranged.

As described above, in a cooling system and a superconducting magnet apparatus according to the one or more of the above embodiments of the present invention, a body of a cryocooler is placed in a vacuum space whereas an end portion thereof is placed in a helium space, thereby obtaining flexibility in the design arrangement of the cryocooler and improving a cooling efficiency.

The above-described methods according to the present invention can be implemented in hardware, firmware or as software or computer code that is stored on a non-transitory machine readable medium such as a CD ROM, a RAM, thumbnail drive, a floppy disk, a hard disk, or a magneto-optical disk or computer code downloaded over a network originally stored on a remote recording medium or a non-transitory machine readable medium and stored on a local non-transitory recording medium, so that the methods described herein are loaded into hardware such as a general purpose computer, or a special processor or in programmable or dedicated hardware, such as an ASIC or FPGA. As would be understood in the art, the computer, the processor, microprocessor controller, or the programmable hardware contain circuitry that is typically integrated, and can include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "controller", "processor" or "microprocessor" constitute hardware in the claimed invention. Under the broadest reasonable interpretation, the appended claims constitute statutory subject matter in compliance with 35 U.S.C. §101 and none of the elements constitute of software per se.

The terms "unit" or "module" as may be used herein is to be understood as constituting or operating in conjunction with hardware such as a circuit, integrated circuit, processor, controller, or microprocessor configured for a certain desired functionality in accordance with statutory subject matter under 35 U.S.C. §101, and such terms do not constitute software per se.

Any of the functions and steps provided in the Figures may be implemented in hardware, software loaded into hardware for execution or a combination of both and may be performed in whole or in part within the programmed instructions of a special computer. No claim element herein is to be construed under the provisions of 35 U.S.C. 112, sixth paragraph, unless the element is expressly recited using the phrase "means for".

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A cooling system comprising:
   a thermal shield unit for thermally shielding a superconducting coil;
   a recondensing unit for recondensing an extremely low temperature refrigerant that cools down the superconducting coil;
   a cryocooler comprising a body and a end portion extending from the body, wherein the end portion of the cryocooler is arranged into the recondensing unit and directly contacts the extremely low temperature refrigerant; and
   a refrigerator chamber penetrating through the thermal shield unit and to which the cryocooler is attachably and detachably provided,
   wherein a sealing member is disposed between the cryocooler and the refrigerator chamber to seal the recondensing unit with the end portion of the cryocooler inserted therein.

2. The cooling system of claim 1, wherein a space between the body of the cryocooler and the refrigerator chamber is in a vacuum state.

3. The cooling system of claim 1, wherein the sealing member comprises a gasket arranged into a body side end circumference of the end portion of the cryocooler.

4. The cooling system of claim 1, wherein a protrusion is formed on a body side end circumference of the end portion of the cryocooler, and
   wherein the protrusion presses the sealing member when the cryocooler is inserted into the refrigerator chamber such that the scaling member is adhered to one side of the refrigerator chamber.

5. The cooling system of claim 4, wherein a partition wall that is adhered to the sealing member and pressed by the protrusion is formed on an inlet circumference of the recondensing unit into which the end portion of the cryocooler is arranged.

6. The cooling system of claim 5, wherein the partition wall is formed to face the protrusion across the sealing member.

7. The cooling system of claim 5, wherein the partition wall extends in a lengthwise direction of the end portion of the cryocooler, and
   the sealing member is slidably inserted and adhered between an inner surface of the partition and an outer surface of the end portion of the cryocooler.

8. The cooling system of claim 1, wherein the sealing member is formed of activated polytetrafluoroethylene, indium, copper, or polyimide.

9. The cooling system of claim 1, wherein the recondensing unit comprises an inlet hole into which the extremely low temperature refrigerant flows in an gaseous state, and an outlet hole of the recondensing unit via which the extremely low temperature refrigerant is discharged in a recondensed and liquefied state.

10. The cooling system of claim 9, wherein the outlet hole of the recondensing unit is arranged below the inlet hole.

11. The cooling system of claim 1, wherein the cryocooler comprises a two-stage refrigerator, wherein the cryocooler further comprises a first stage for cooling down the thermal shield unit and the end portion comprises a second stage that extends from the first stage.

12. The cooling system of claim 11, wherein a heat sink thermally contacts at least a part of a circumference of the first stage of the cryocooler, and contacts the thermal shield unit.

13. The cooling system of claim 1, wherein the refrigerator chamber is formed horizontally or in a slanted position with respect to the thermal shield unit.

14. The cooling system of claim 1, wherein the extremely low temperature refrigerant comprises helium.

15. The cooling system of claim 1, further comprising a low temperature container that contains the extremely low temperature refrigerant, wherein the superconducting coil is cooled down by immersion in the extremely low temperature refrigerant in the low temperature container.

16. The cooling system of claim 15, wherein the recondensing unit is spatially separated from the low temperature container and is connected to the low temperature container by pipe through which the extremely low temperature refrigerant flows in an gaseous state, and a pipe through which the extremely low temperature refrigerant flows in a recondensed and liquefied state.

17. The cooling system of claim 1, further comprising a thermal exchange tube containing the extremely low temperature refrigerant, wherein the superconducting coil is cooled down by contact with the thermal exchange tube.

18. A superconducting magnet apparatus comprising:
    a superconducting coil;
    a housing on which the superconducting coil is mounted; and
    a cooling system for cooling the superconducting coil,
    wherein the cooling system comprises:
    a thermal shield unit for thermally shielding the superconducting coil;
    a recondensing unit for recondensing an extremely low temperature refrigerant that cools down the superconducting coil;
    a cryocooler comprising a body and a end portion extending from the body, the end portion being arranged into the recondensing unit, and the end portion being in directly contact with the extremely low temperature refrigerant; and a refrigerator chamber penetrating through the thermal shield unit and to which the cryocooler is attachably and detachably provided, wherein a sealing member is disposed between the cryocooler and the refrigerator chamber to seal the recondensing unit when the end portion of the cryocooler is arranged in recondensing unit.

19. The superconducting magnet apparatus of claim 18, wherein the cryocooler of the cooling system is provided at one of a side surface, a top surface, or a bottom surface of the housing.

20. The superconducting magnet apparatus of claim 18, wherein the superconducting magnet apparatus comprises a magnet resonance imaging (MRI) apparatus.

* * * * *